United States Patent [19]

Amey et al.

[11] Patent Number: 4,839,830

[45] Date of Patent: Jun. 13, 1989

[54] APPARATUS AND METHOD FOR THE PROCESSING OF OPERATING DATA OF AN ELECTRIC MOTOR

[75] Inventors: Walter Amey, Erlangen; Reinhold Schneeberger, Seukendorf, both of Fed. Rep. of Germany

[73] Assignee: Siemens Aktiengesellschaft, Berlin and Munich, Fed. Rep. of Germany

[21] Appl. No.: 23,655

[22] Filed: Mar. 9, 1987

[30] Foreign Application Priority Data

Mar. 10, 1986 [DE] Fed. Rep. of Germany ....... 3607878

[51] Int. Cl.⁴ .......................... G07C 3/08; G06F 15/46
[52] U.S. Cl. ................................ 364/551.01; 364/508
[58] Field of Search ... 364/200 MS File, 900 MS File, 364/551, 481, 508

[56] References Cited

U.S. PATENT DOCUMENTS

| | | |
|---|---|---|
| 3,553,550 | 4/1969 | Schemmann . |
| 4,245,316 | 1/1981 | Koikawa et al. ................ 364/900 |
| 4,307,455 | 12/1981 | Juhasz et al. .................... 364/900 |
| 4,558,430 | 12/1985 | Mogami et al. ................. 364/900 |

FOREIGN PATENT DOCUMENTS 2150774 7/1984 United Kingdom .

OTHER PUBLICATIONS

Monitoring Turbogenerators in the Underfrequency Range; BBC Brown Boveri Review, vol. 67, (1980), Sep., pp. 530–534.

Primary Examiner—Gareth D. Shaw
Assistant Examiner—Debra A. Chun
Attorney, Agent, or Firm—Kenyon & Kenyon

[57] ABSTRACT

Apparatus for processing motor operating data for an associated electric motor comprises a processing unit coupled to a motor stress operating data sensor and a real time clock. It further comprises a power supply coupled to the motor such that the apparatus is powered by power derived from the motor. The data processing method includes the steps of collecting the operating data and, when it exceeds predetermined criteria data for the particular associated motor, storing the operating data and time of occurrence data provided by the real time clock in a data memory for subsequent data read out. In this manner, a motor biography may be reconstructed for the actual or service life of the motor.

12 Claims, 5 Drawing Sheets

APPARATUS AND METHOD FOR THE PROCESSING OF OPERATING DATA OF AN ELECTRIC MOTOR

BACKGROUND OF THE INVENTION

The invention relates to the field of electric machinery and, more particularly, to apparatus and a method for processing operating data for an electric motor.

Apparatus and methods are known, for example, from the design of speed controls for electric motors that motor operating data may be continuously sensed as to, for example, the speed of rotation, angle of rotation, motor current and the like. The different types of data can be correlated with one another as well as with associated predetermined reference levels in order to determine what speed control signals might be required in a particular situation for transmission to motor speed control devices within the scope of this known processing, the actual operating motor data is only temporarily stored in data memory of a processing device, for example, for a few data cycles or for a very short duration as compared to the expected or actual service life of the electric motor controlled.

Large electric motors such as high-voltage motors represent high-value investments. Their long term availability for service, the economic efficiency of their capital-intensive installations, and the reliability of associated protection devices depends on the optimum planning of their replacement and their scheduled maintenance. Planning for maintenance and replacement should be accomplished dependent on the actual stress of the associated motor, instead of at rigid intervals normally selected based on an estimated nominal or maximum motor stress level.

To optimally choose a maintenance schedule or date of replacement, however, requires precise knowledge of the actual motor stress over an extended period if not the entire service life of the respective electric motor, but the data need only be recorded during its period of actual use, i.e. the knowledge of its actual life cycle. Biographic events of the motor, however, cannot be reconstructed from the known control devices and methods at least because of the, at most, brief storage of the operating data. Furthermore, such data processing should be relatively secure in the event of dispute between motor manufacturer and user over warranty or motor abuse issues.

Consequently, the problem posed by known devices and methods is that there is a need for a long term, yet secure processing of certain motor operating data. Compared with known speed control devices and methods, there is a far greater quantity of data involved, the data is related primarily to stress, and the data must be preserved for a much longer period of time.

SUMMARY OF THE INVENTION

The problems and related problems of the prior art devices and methods are solved by the principles of the present invention comprising a real time clock, a motor stress sensor and a data processor powered by a common power supply coupled to an associated motor from which the power supply derives its power. The present apparatus is secure, self-contained and is provided, most conveniently, as an integral unit of its associated motor. At least for the periods of actual motor use, a stress biography for the associated motor can be obtained. Such a biography permits an economical selection of a maintenance schedule based on actual data. It furthermore solves the problem of determining causes of motor faults which are the result of a possible power disturbance or user abuse as objectively as possible when questions of warranty and consequent liability arise. Since the failure of an electric motor is as a rule not the result of a single overload event but frequently based on a long-time accumulation of such events since the first startup of the motor, such a stress biography can provide the manufacturer with answers to questions as to what are the typical causes of motor breakdowns. The possibility which now exists of proving that the user maintained or exceeded the operating conditions of the motor as prescribed by the manufacturer is equally in the interest of the user as of the manufacturer.

The present apparatus may be powered by the power supply in a derived manner from an auxiliary stator winding or from the power leads to the motor. In either case, power is most appropriately supplied only when needed by the processor to actuate a data sensing and collection.

Backing up the power supply of the apparatus with a long-life battery has the advantage that the real-time clock will provide the accurate time in the event the energy supply from the power supply unit fails. Also, the battery back-up prevents a loss of the possibly volatile contents of a program memory or a data memory associated with the data processor. The unequivocally secure relationship of the present processing apparatus and the electric motor, at least over its service life insures the easy and unequivocal reconstructibility of the biography of the motor in question.

The long term specialization of the intended application of the present apparatus to a recording activity permits the advantageous possibility of providing separate data read-out equipment or other equipment associated with the electric motor to be monitored. This separate data read-out equipment can be separately powered and can further process the data to provide graphs or other desirable output. By means of this separate equipment, new criteria for the selection of operating data to be stored can be transmitted to the present apparatus, for instance, for the adaptation of the present apparatus to new operating conditions or to another motor.

During data readout, the electric motor is most conveniently at rest and not available to provide a direct or indirect energy source for the present apparatus. Consequently, the external separate data read-out equipment can advantageously supply power to the apparatus during the readout process, thus saving the long-life battery provided to back up the power supply to the apparatus.

It is not necessary, due to possible exhaustion of the storage capacity of the data memory, to stop either the storage of motor operating data in data memory or to give up previously stored operating data without replacement. In accordance with the method according to the invention, there is a particularly taught compression of stored operating data. Also, after the stored data is periodically read out, the data memory locations can be occupied by new data without the loss of information to the user.

DETAILED DESCRIPTION

Figure 1A:
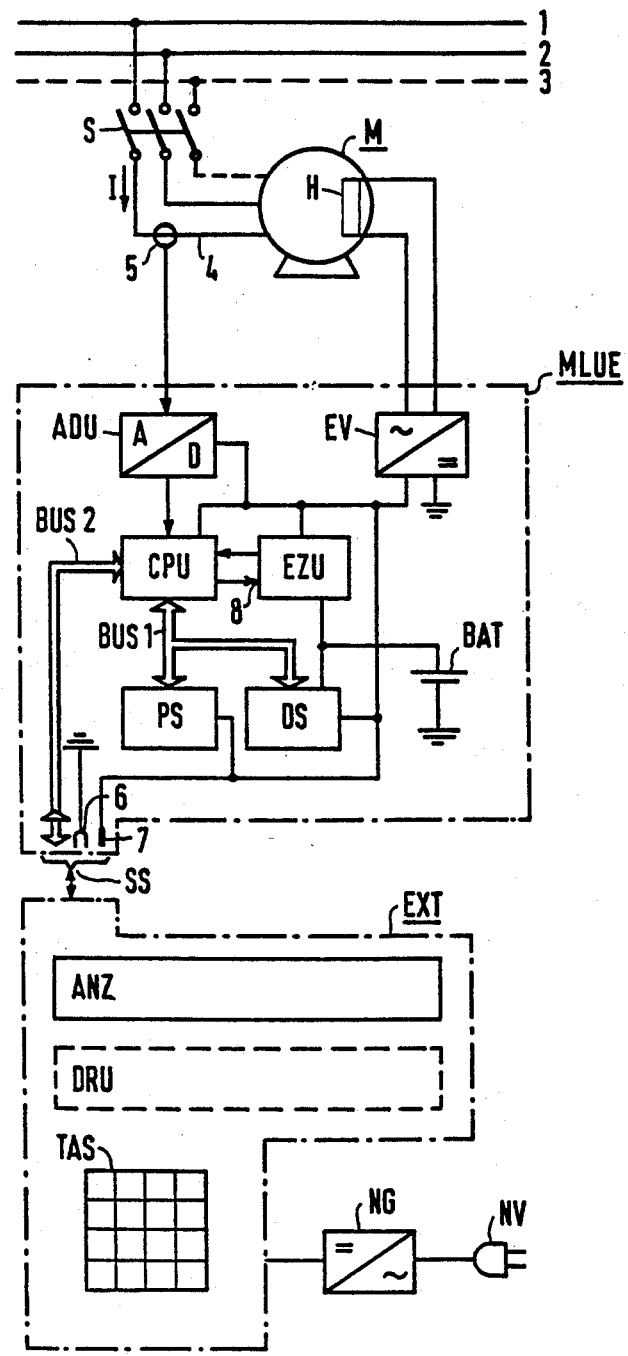
FIG. 1A is a schematic block diagram of apparatus according to the invention including a power supply further showing an electric motor to be monitored and an external data readout unit, the power supply being connected to an additional stator winding of the motor.

Referring to FIG. 1A, an electric motor M to be monitored is supplied with electric energy from power lines 1, 2 or 1, 2, 3, respectively, by means of a power switch, depending on what form of power is required for motor operation: high-voltage or low-voltage d-c or a-c, single phase or multi-phase current. Motor data processing apparatus MLUE is designed to be powered regardless of the type of power supplied to the motor by appropriate connection and design of power source EV and its means for deriving power from the power supplied to motor M. Consequently, apparatus MLUE may be designed independently of whether the switch S reverses the direction of rotation of the motor as a polarity reversing switch, comprises several switch positions or is realized by means of contactless electronic components such as controlled rectifiers used, for instance, in speed controlled motor drives.

Processing apparatus MLUE comprises a central processing unit CPU, which most conventionally is an inexpensive microprocessor integrated circuit. Associated with processing unit CPU is a bus system BUS 1 over which processing unit CPU is in two way communication with a program memory PS and a data memory DS. Program memory PS stores operating, initiating and maintenance programs for the operation of processing unit CPU. Data memory DS stores the operating data for motor M and associated clock data from a real time clock system EZU as well as a stress parameter selected and an indication of predetermined parameter values collectable from a motor stress sensor 5 which will be discussed more particularly subsequently.

Processing unit CPU is connected to motor stress sensor 5 by means of analog to digital (A/D) converter circuit ADU. Stress data is correlated with real time data requested over line 8 of real time clock EZU and stored via bus system BUS 1 in data memory DS.

A power supply EV is provided which derives its power from motor M either by way of an additional stator winding H of the motor M or by direct connection to a power lead to the motor such as lead 4 (not shown). Power supply EV powers A/D converter circuit ADU, processing unit CPU, real time clock EZU, as well as program and data memories PS and DS respectively.

A battery back-up BAT is also provided, for powering real time clock EZU and volatile portions of data memory DS, (or even program memory PS, not shown) since the power supply EV, connected to the motor, operates when the motor is powered and provides no power when the motor is turned off.

Lastly, processing apparatus MLUE comprises an external bus and line system coupled to an interface SS for external device connection. In particular, at interface SS, there are supplemental power leads 6 and 7 and a bi-directional bus BUS 2 providing access to processing unit CPU. The power leads 6, 7 provide an additional means of powering program memory PS, data memory DS, processing unit CPU, real time clock EZU and A/D converter circuit ADU when external data read-out unit EXT is connected to the apparatus MLUE by way of the interface SS.

The apparatus MLUE monitors motor stress-type operating data of the electric motor M which may comprise such types of operating data as the angle of motor rotation, speed of rotation, acceleration of rotation, torque, output power, thermal stress, motor voltage, motor current or other mechanical and electrical stress operating data that could be monitored. In the arrangement according to FIGS. 1A and 1B, the motor current I is sensed as just one example of a parameter related to the actual stress on the motor. This motor current is measured by means of motor stress sensor 5. Since the stress parameter selected is motor current, then, motor stress sensor 5 may be a current transformer coupled to power lead 4 to motor M. The current value signals representing the current flowing in the lead to the electric motor M are smoothed and digitized in an a/d converter circuit ADU. The digitized sample outputs are then fed to the central processor unit CPU by the A/O converter circuit ADU. The processor unit CPU continuously collects, according to a program contained in the program memory PS, the incoming actual values of the motor current I from A/D converter circuit ADU and has already stored predetermined limits for such values in data memory DS. It further records on, reverse and off motor operations as well as start-up times for the electric motor M following turn "on" operations. The processor unit CPU correlates such stress operating data, here, current data, with data regarding the absolute time of their occurrence and stores the data Via the data bus BUS 1 together in a data collection D in the data memory DS. To this end, it receives the absolute time data from the real time clock EZU, for instance, an integrated real time clock of the type RTC 58321 S-83, a real time clock system manufactured by Suwa Seiko, Japan. This Suwa Seiko clock system counts seconds of time up to one year with an accuracy of about ± one second per day. It has a maximum deviation of about ± one hour in the course of ten years which deviation can be reduced even further if the stored operating and time data are read-out more frequently than every ten years and the calibration of the real time clock EZU is corrected on each read-out.

Figure 1B:
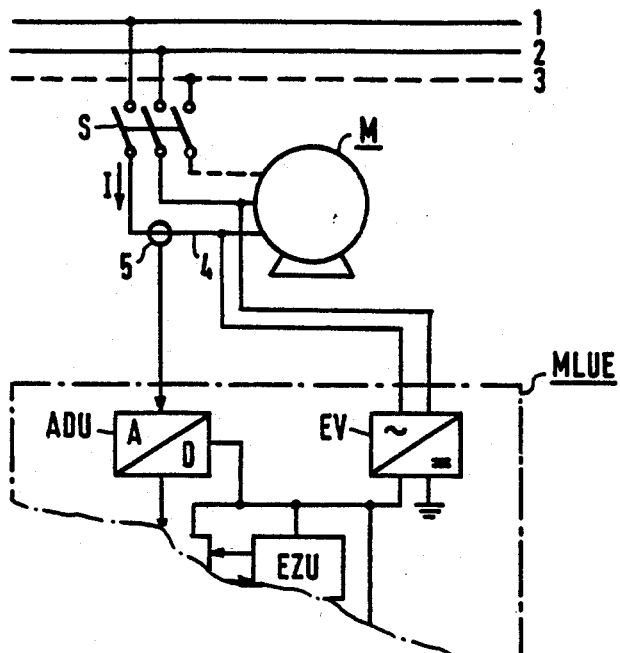
FIG. 1B is a schematic block diagram of the apparatus of FIG. 1A in partial cut-away wherein the power supply is connected to the motor power supply leads.

The power supply EV for apparatus MLUE provides power at least during the active times of the electric motor M and is not shut down, for instance, by simply disconnecting it from a general supply network. The processing apparatus MLUE, besides having at its disposal the absolute time, is autonomous and operationally safe. Referring briefly to FIG. 1B, the power supply unit EV may take its input energy from the motor power supply leads including the lead 4 feeding the electric motor M. The tap point should be accessible only in a secure manner, for instance, by being sealed. Referring again to FIG. 1A, feeding the apparatus MLUE power without actual metallic connection to the power source is also sufficient. Consequently, an auxiliary generator winding H may be additionally installed in the stator of the electric motor M and furnishes current exactly when the electric motor M is active. Design of the power supply unit EV so that it can be produced in quantity and be applied with different motor types (permitting different voltages to be generated at the auxiliary winding H) is assured by providing several taps on the primary side of a transformer located in an input section of the power supply unit EV (not shown).

A long-life battery BAT is provided to back up power source EV. It assures that during shutdown times of the electric motor M, during which the power supply unit EV itself is without current, the real time clock EZU will continue to run without interruption and the contents of the data memory DS and, if necessary, the program memory PS, (not shown) to the extent that they are volatile, are not lost. The typical current drain of the data and program memories DS, PS and the clock EZU together is, for instance, 15 to 60 microamps, corresponding to about 4.3 ampere-hours in ten years. Lithium cells are particularly well suited for this backup use because their expected service life is in the range of ten years.

The described apparatus MLUE is, for technical reasons and to avoid tampering, encapsulated and sealed in a completely closed housing including the interface SS. To promote this security further, the use of electronic components is advisable which develop only a small amount of heat to be dissipated, for instance, electronic components in CMOS technology. The apparatus MLUE is advantageously assigned to a particular motor for an extended period of time and may be assigned for the entire actual or service life of the electric motor M. In other words, apparatus MLUE may not necessarily be used for another motor when it is associated with one particular motor. In this manner, security is more assured for the reconstruction of the associated motor M biography from the date of installation of the apparatus MLUE. Particularly practical is the direct physical arrangement of a housing containing the device MLUE at or within the electric motor M. Since the described device does not necessarily intervene in the operating cycle, or the control of the electric motor M, any desired type of motor can be equipped or re-equipped with the present apparatus.

In order to keep the power consumption of the apparatus MLUE and its cost within economical limits, it is appropriate not to use a separate data display or printout unit for each individual installation of apparatus MLUE, for instance, a display of its own or even a printer of its own, but rather an external data read-out unit EXT, can read-out, by way of the interface SS of each apparatus MLUE, the operating and time data stored in the data memory DS for display on a display unit ANZ or to obtain a printout from a printer DRU. To this end, the user conducts a dialog with apparatus MLUE from the external readout unit EXT via the keys of a keyboard TAS of the external readout unit EXT coupled to the interface SS. The data transfer must, of course, be carried out only by authorized persons. In particular, data transfer occurs via the bidirectional data bus BUS 2 which, in the case of a serial interface, is only 1 bit wide.

If the electric motor M is standing still during the readout process and, as a result, does not furnish energy to the power supply unit EV, the external readout unit EXT takes over this duty by way of a network connecting plug NV, the power supply unit NG and the terminals 6, 7 of the interface SS to the energy supply EV of the apparatus MLUE. If the electric motor M is running during the readout process, the central processor unit CPU temporarily stops (for the duration of the communication with the external data readout unit EXT) the processing and storage of motor operating and time data.

After the end of the data readout process, the data memory DS is either erased immediately and thereby cleared for receiving future operating data or it is gradually released for writing of new data over old data.

Independently of the data readout process, but advantageously at the same time for practical reasons, the dialog with the apparatus MLUE can be used by way of the external data readout unit EXT to correct or calibrate the reading of the real time clock EZU by means of the latter's data request and setting input 8. Also, new criteria (for instance, motor current predetermined limits) for storing operating data may be stored or a new motor stress parameter chosen, for instance, from the earlier listed types of motor operating data related to motor stress. Thereby, the apparatus MLUE can also be adapted to new purposes by means of bidirectional bus BUS 2. The processor retransmits such changes to memory by way of bidirectional bus BUS 1.

Figure 2:
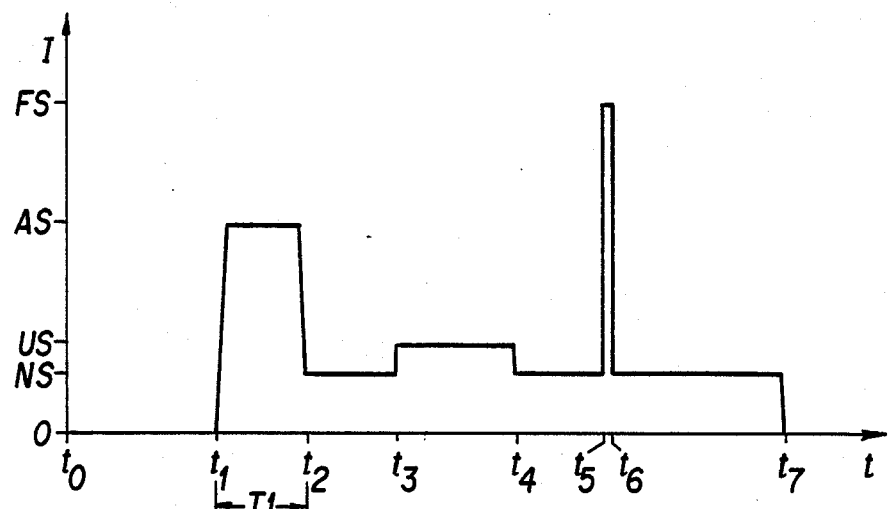
FIG. 2 is a time diagram showing a typical motor current waveform from a time when the present apparatus is installed through motor start-up and typical events which may occur during the service life of the motor.
Figure 3:
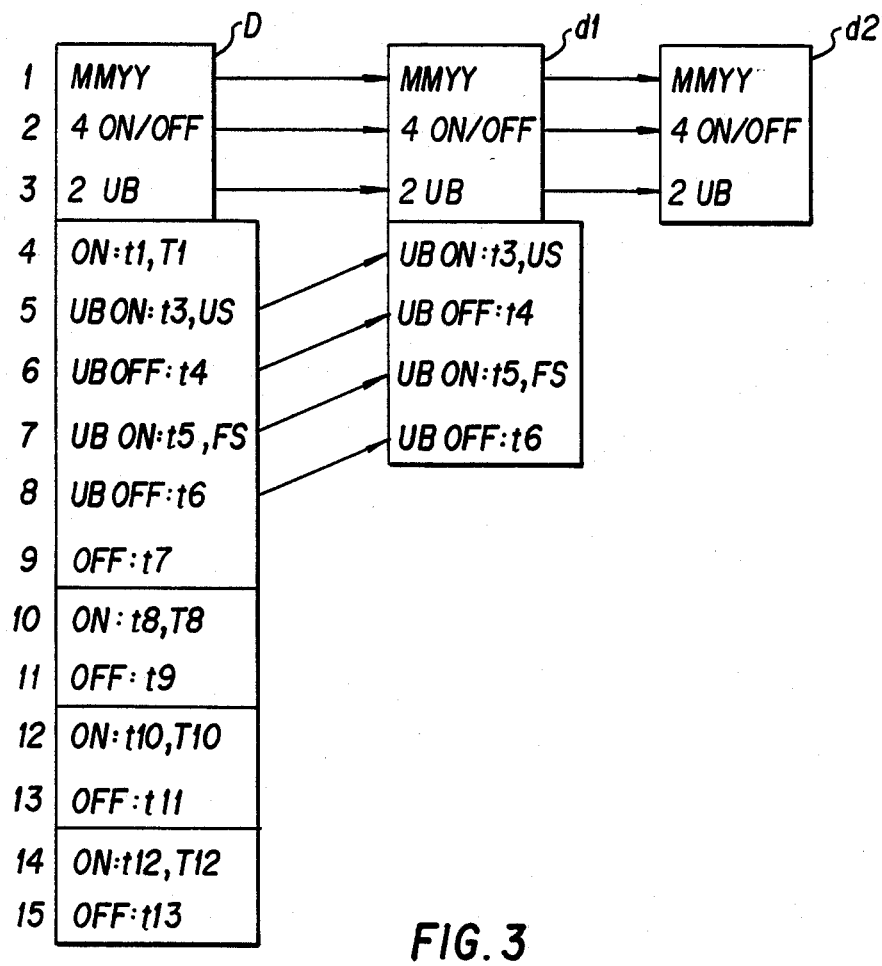
FIG. 3 is a data compression diagram for a motor operating data structure undergoing two stages of data compression techniques in accordance with the method of the present invention.

Referring to FIGS. 2 and 3, the predetermined current limits which trigger the storage of motor operating and time data, as well as an advantageous kind of data storage and compression will be discussed. A time diagram showing the motor current waveform versus an absolute time t is shown in FIG. 2. The depicted typical waveform for the motor current I begins at time to, assumed to be the time of association of the present apparatus with the particular motor monitored. The waveform jumps at the time t1 from a zero current level to the starting current AS during an initial motor switching on process. The instant t1 of the turn on and the starting-up duration T1 are stored as an event essential for the motor operation in the data memory DS. Referring to FIG. 3, it is shown that the data is stored in a data collection D at line 4. The startup is completed at the time t2, the instant of the return of the motor current I to a nominal motor current value NS.

At the time t3, an overload of the electric motor M sets in, as is recognized by the rise of the motor current I to an overload current value US which is clearly above the nominal current NS. At the time t4, the motor current I returns to the nominal current level NS. Referring particularly to FIG. 3, the setting-in of the overload UBE is stored in data collection D as the time t3 along with the maximum value US, the overload current level occurring during the overload at line 5. Likewise, the time t4 of the decay UBA of the overload is stored at line 6.

At the time t5 there occurs through, for example, a network disturbance, an erroneous switching on of a running-down of the electric motor M, a polarity reversal of the running electric motor M or a similar event which causes a brief, steep rise of the motor current I to an erroneous synchronization current FS which lasts until the time t6. The corresponding overload data UBE, UBA are then stored. Referring to FIG. 3, appropriate data is stored in data collection D at lines 7 and 8.

Finally, the motor current I drops at the time t7 from the nominal current NS to zero. The switching-off process determined thereby is likewise recorded. Referring to FIG. 3, the data is stored in data collection D at line 9. Further Motor ON/OFF switching events not shown in FIG. 2 are shown recorded in FIG. 3 in the data collection D on lines 10 to 15. It is further worthy of note that the startup current AS, normally larger than the nominal current NS, needs to be recorded as an overload case only if it exceeds a separate predetermined limit for the starting current which may be stored in data memory DS. Furthermore, the erroneous synchronization current FS which is recorded as an overload case, may be recognized as such by its magnitude during data read out, that is after it is compared with a predetermined level which can likewise be set separately in memory.

For each particular motor M that may be associated with processing apparatus MLUE on its installation, the predetermined level of nominal operating current NS or the predetermined level differentiating an overload condition from a network disturbance will vary with the size and operating characteristics of the motor. Furthermore, the stress parameter measured may vary in relation to the choice of stress parameter sensor 5 and its connection to motor M. In any particular situation, however, these predetermined levels and choice of stress parameter will be relatively fixed criteria data in data memory DS. However, as earlier explained, the criteria data may be externally changed, for example, if it is desired to connect motor stress sensor 5 differently or replace it with a sensor for sensing a different type of motor operating data related to motor stress besides motor current.

If in the course of time, the collected operating and time data D threaten to exhaust the capacity of the data memory DS of the apparatus MLUE, such that either no further data can be received or valuable stored data will be written-over without being read out, one or more data collections D, particularly starting with the oldest collected data, can be compressed in one or more stages. One way to achieve such compression is to process the data into statistical values, that is means, modes, nominal values, peak values and such. Alternatively, in a first stage of data compression, for example, individually stored data regarding motor ON/OFF switching events (see FIG. 3, data collection D, lines 4 and 9 to 15) can be erased (see data set d1) if the summary data stored in the month and year field under MMYY storing the fact that four ON/OFF switching actions and detail data regarding the two overload conditions which occurred during the particular month is sufficient for statistical purposes with respect to the month and year under consideration in view of the motor's possibly long past. In the next data compression stage, the particular data regarding the two overload cases UB can be erased from data-collection d1 upon its removal to data collection d2 if not particularly required. Referring to FIG. 3 there is also shown that after the first or second data compression stages that, since the motor ON/OFF or overload data is no longer required to be stored it can be immediately erased or gradually written over. It is assumed, in the second data compression stage, that for that particular month and year, the recordation of the occurrence of two overload conditions is sufficient for statistical purposes without preserving the particular time or the magnitude of each overload condition. The effectiveness of this data compression can be judged from the fact that through such data compression a 40-kilobyte memory would be estimated to be sufficient for storing more than 6000 months of data, corresponding to 500 years.

Figure 4A:
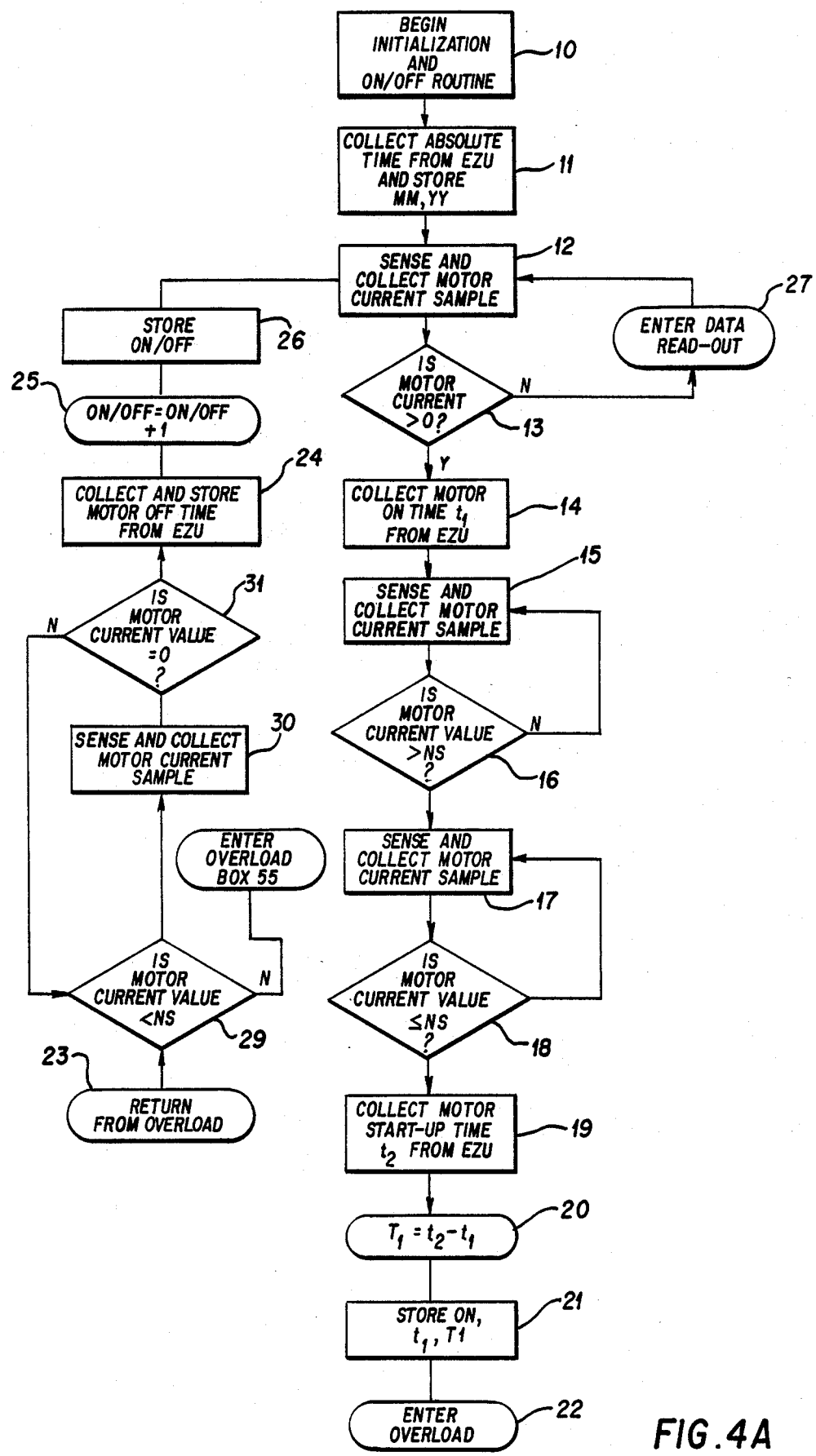
FIG. 4A is a flow chart of an ON/OFF routine for determining motor turn on and off conditions.
Figure 4B:
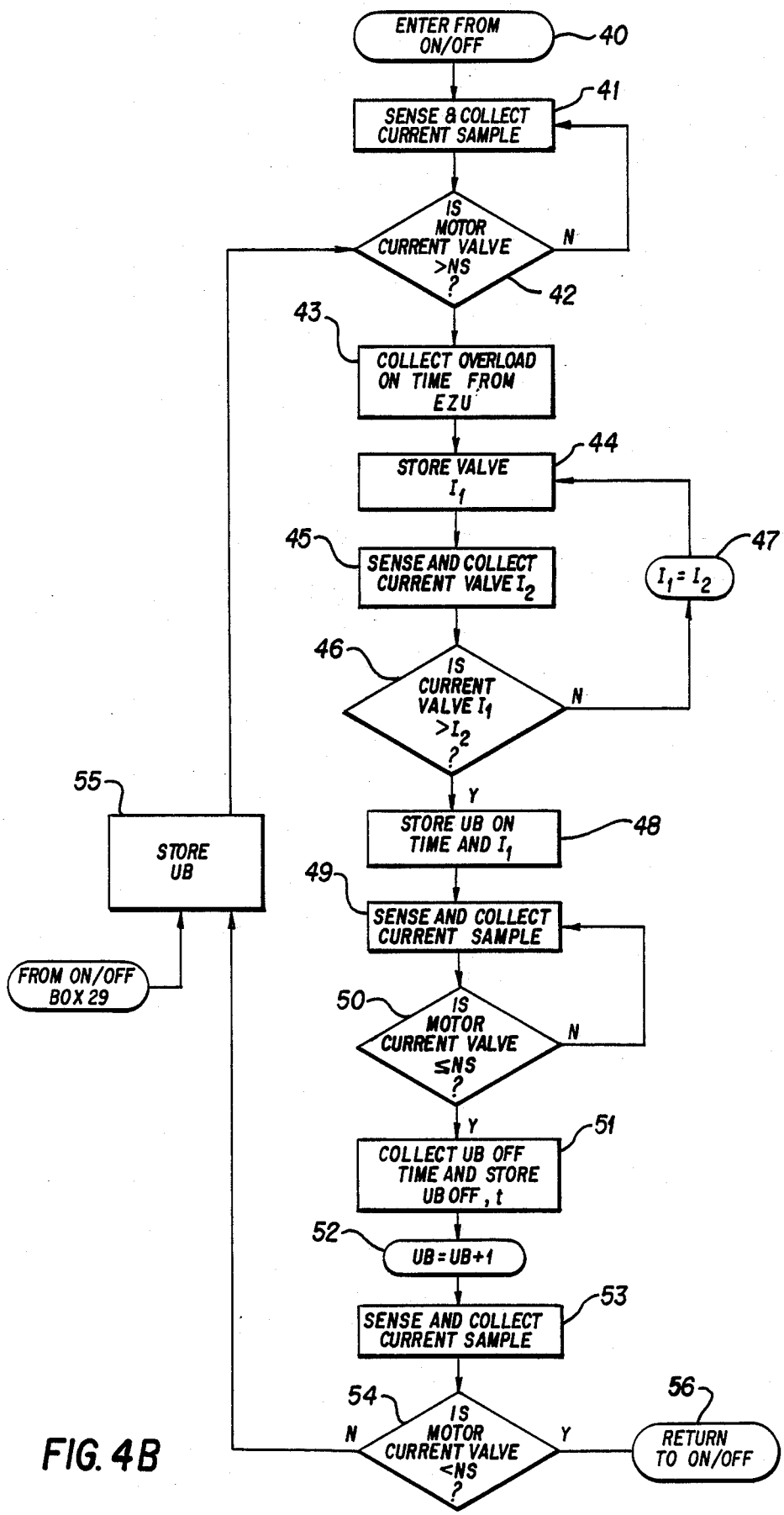
FIG. 4B is a flow chart of an OVERLOAD routine for determining motor overload conditions.

Referring to FIGS. 4A and 4B, there is shown one algorithm in flowchart form for the present invention. In particular, FIG. 4A relates to a motor ON/OFF subroutine while FIG. 4B relates to an OVERLOAD condition subroutine.

Referring first to FIG. 4A, the ON/OFF routine is entered when power is supplied either by the power supply EV or by way of interface SS and after the processing unit CPU has been initialized at box 10. At box 11, the absolute time is collected from real time clock EZU. Referring to FIG. 3, the month and year data are stored in data collection D at line 1.

At box 12, the first motor current value is collected from sensor 5 while, at box 13, the sensed current value is compared with no current to determine if the motor has been turned on. If the answer is NO, then, it is clear that the power is being provided by an external source through interface SS and a data read-out routine is entered at box 27, not further described. Alternatively, the data read out mode may be entered by programming the processing unit to periodically sense whether there is an input request over bus system BUS 2. The advantage with the presently described arrangement is that the data readout subroutine is automatically entered after the motor power is turned off and the external data readout device EXT is coupled to the interface SS.

Assuming that the answer at decision box 13 is YES, the motor ON time is collected from the real time clock and temporarily held in storage. At box 15, another current value is collected from sensor 5. At box 16, it is compared with nominal current value NS to see if it is exceeded. If not, current values are repetitively sensed until the nominal value is exceeded. Alternatively, as explained earlier, instead of a comparison with a nominal value NS, the current value could be compared with a prestored start-up current level at box 16.

At box 17, if the current value has exceeded the nominal value, another current value is sensed in order to determine at box 18 if it has fallen to nominal value NS. If it has not, the process is repeated. If it has, then, motor start-up has completed and the duration of motor start-up is calculated in accordance with $T1 = t2 - t1$ and is stored along with ON time t1 in data memory at line 4, for example, as shown in FIG. 3.

One of the purposes of the overload mode entered at box 22 is also to determine if the motor may have been turned off, and so, if the next sensed current value is less than nominal value NS, there is entered a repetitive check to see if the current value has reached zero at boxes 29, 30, and 31. If the current has reached zero, then the motor OFF time is collected and stored at box 24. At box 25, the number of ON/OFF occurrences for the month and year MM,YY is incremented by one and stored at box 26.

The other primary purpose of the overload routine entered at box 48 is to detect and record overload conditions. Referring to FIG. 4B, the current value is sensed and collected at box 41 and repetitively compared at box 42 with the nominal value NS until it is clear there is an overload condition. Then at box 43, the beginning absolute time of the overload is collected at box 43. At box 44, the current value $I_1$ is temporarily stored or written over as a subroutine is entered to determine if the peak overload current has yet been reached. This latter process is initiated at box 45 where a new current value $I_2$ is sensed and collected and at box 46 compared with already stored value $I_1$. If the stored value $I_1$ does not exceed the next value $I_2$, then, the peak has not been reached. The new current value is stored for formerly stored current value $I_1$ at box 47 and the loop repetitively performed. If the stored value $I_1$ exceeds the new values $I_2$ then the peak value has been reached and the answer is Yes at box 46. The overload ON occurrence is recorded along with the value $I_1$, which, for example, may be either the value AS or FS at box 48. As explained earlier, additional comparisons may be made with predetermined criteria data for different causes of overload conditions to distinguish types of overloads if desired.

At box 49, current values are repetitively collected in order to determine at box 50 if the current value has fallen to nominal value NS. If it finally has, at box 51, the overload OFF condition UB OFF is stored along with its time of occurrence. Then, at box 52 the overload condition counter UB is incremented by one.

Now at box 54, a new current value, collected at box 53, is checked to determine if the motor has probably been turned off, and the ON/OFF routine reentered at box 56.

If not, then the overload condition UB counter is stored at box 55 and the program begins again to search either for an overload condition or the motor's being turned off.

What is claimed is:

1. Apparatus for processing operating stress data associated with a particular electric motor connected to a power network by an ON/OFF switch, the data processing apparatus comprising:
   (a) a processing unit for processing data;
   (b) a program memory storing operating programs of the process unit;
   (c) a data memory storing the operating stress data associated with the particular electric motor, time of occurrence data of the operating stress data, and predetermined criteria data for the particular electric motor, the data memory of a size such that operating stress data occurring over at least a portion of the life and duration of use of the motor may be stored;
   (d) a real time clock connected to the processing unit for providing time of occurrence data;
   (e) a first bidirectional bus system connecting the processing unit with the program memory and the data memory;
   (f) means coupled to the motor for sensing a quantity related to motor operating stress as motor operating stress data, and for providing the operating stress as motor operating stress data, and for providing the operating stress data to the processing unit; and
   (g) a power supply coupled to a power feed line for the associated particular electric motor from the power network for providing power to the processing unit, the real time clock, the program memory and the data memory,
   the processing unit comparing the motor operating stress data with the predetermined criteria data and storing the motor operating stress data and the time of occurrence data in the data memory as a data collection when the motor operating stress data exceeds the predetermined criteria data.

2. The data processing apparatus of claim 1 further comprising:
   a back-up power source of a long-life battery coupled to the real time clock and the data memory, the back-up power source providing power to the real time clock and to the data memory such that the real time clock continues to run and volatile data is not lost in the event power is not provided by the power supply coupled to the motor.

3. The data processing apparatus of claim 1 wherein said apparatus is located near or within the associated particular electric motor.

4. The data processing apparatus of claim 1 further comprising:
   an interface to an external data read-out device and a second bidirectional bus system coupling the interface and the data processing unit.

5. The data processing apparatus of claim 4 wherein the interface is bidirectional such that operating and time of occurrence data may be read-out of data memory and criteria data replacing existent criteria data may be stored in data memory.

6. The data processing apparatus of claim 4 further including power supply leads connected to the power supply wherein the interface is coupled to the power supply leads to the power supply such that the external data readout device supplies power to the data processing apparatus during data read-out processes.

7. Apparatus for processing operating stress data associated with a particular electric motor connected to a power network by an ON/OFF switch, the data processing apparatus comprising:
   (a) a processing unit for processing data;
   (b) a program memory storing operating programs of the processing unit;
   (c) a data memory storing stress data associated with the particular electric motor, time of occurrence data of the operating stress data, and predetermined criteria data for the particular electric motor, the data memory of a size such that operating stress data occurring over at least a portion of the life and duration of use of the motor may be stored;
   (d) a real time clock connected to the processing unit for providing time of occurrence data;
   (e) a first bidirectional bus system connecting the processing unit with the program memory and the data memory;
   (f) means coupled to the motor for sensing a quantity related to motor operating stress as motor operating stress data, and for providing the operating stress data to the processing unit; and
   (g) a power supply coupled to an additional stator winding of the associated particular electric motor for providing power to the processing unit, the real time clock, the program memory nd the data memory,
   the processing unit comparing the motor operating stress data with the predetermined criteria data and storing the motor operating stress data and the time of occurrence data in the data memory as a data collection when the motor operating stress data exceeds the predetermined criteria data.

8. The data processing apparatus of claim 7 further comprising:
   an interface to an external data read-out device and a second bidirectional bus system coupling the interface and the data processing unit.

9. The data processing apparatus of claim 8 wherein the interface is bidirectional such that operating and time of occurrence data may be read-out of data memory and criteria data replacing existent criteria data may be stored in data memory.

10. The data processing apparatus of claim 8 further including power supply leads connected to the power supply wherein the interface is coupled to the power supply leads to the power supply such that the external data readout device supplies power to the data processing apparatus during data read-out processes.

11. The data processing apparatus of claim 7 further comprising:

a back-up power source of a long-life battery coupled to the real time clock and the data memory, the back-up power source providing power to the real time clock and to the data memory such that the real time clock continues to run and volatile data is not lost in the event power is not provided by the power supply coupled to the motor.

12. The data processing apparatus of claim 7 wherein said apparatus is located near or within the associated particular electric motor.

* * * * *